United States Patent

Bachus et al.

[11] Patent Number: 4,776,341
[45] Date of Patent: Oct. 11, 1988

[54] NUCLEAR MAGNETIC RESONANCE TOMOGRAPHY APPARATUS WITH GALVANIC CONNECTIONS TO THE EXAMINATION SUBJECT

[75] Inventors: Reiner Bachus, Buckenhof; Günter Brill, Schiffweiler; Michael Deimling, Forchheim, all of Fed. Rep. of Germany

[73] Assignee: Siemens Aktiengesellschaft, Berlin and Munich, Fed. Rep. of Germany

[21] Appl. No.: 17,991

[22] Filed: Feb. 24, 1987

[30] Foreign Application Priority Data

Mar. 5, 1986 [DE] Fed. Rep. of Germany ....... 3607274

[51] Int. Cl.⁴ ................................................ A61B 5/05
[52] U.S. Cl. .................................. 128/653; 324/309; 324/318
[58] Field of Search ................. 128/653, 639; 324/309, 324/318

[56] References Cited

U.S. PATENT DOCUMENTS

| | | | |
|---|---|---|---|
| 3,029,808 | 4/1962 | Kagan | 128/696 |
| 4,590,947 | 5/1986 | Krause | 128/653 |
| 4,607,226 | 8/1986 | Zeiger | 324/318 |
| 4,617,936 | 10/1986 | Malko | 128/653 |
| 4,694,837 | 9/1987 | Blakeley et al. | 128/653 |

FOREIGN PATENT DOCUMENTS

| | | |
|---|---|---|
| 0084946 | 8/1983 | European Pat. Off. . |
| 0117725 | 9/1984 | European Pat. Off. . |
| 0132785 | 2/1985 | European Pat. Off. . |
| 3340523 | 5/1985 | Fed. Rep. of Germany . |

Primary Examiner—Ruth S. Smith
Attorney, Agent, or Firm—Hill, Van Santen, Steadman & Simpson

[57] ABSTRACT

A nuclear magnetic resonance tomography apparatus has coils for respectively generating fundamental and gradient magnetic fields in which an examination subject is disposed, and RF coil for displacing the nuclear spins of the examination subject from an equilibrium position, and direct galvanic connections to the examination subject for obtaining the nuclear magnetic resonance signals arising during relaxation of the excited nuclear spins. The examination subject thus becomes a part of the reception antenna or the feed line thereof, thus avoiding the use of an RF coil for acquiring such signals.

4 Claims, 2 Drawing Sheets

NUCLEAR MAGNETIC RESONANCE TOMOGRAPHY APPARATUS WITH GALVANIC CONNECTIONS TO THE EXAMINATION SUBJECT

BACKGROUND OF THE INVENTION

1. Field of the Invention

The present invention relates to nuclear magnetic resonance tomography devices for visual representation of regions of the interior of an examination subject, and to methods for operating such devices.

2. Description of the Prior Art

Nuclear magnetic resonance tomography devices are known in the art wherein a patient is disposed within a fundamental magnetic field and a plurality of gradient magnetic fields and radio-frequency excitation pulses are applied to the examination subject to displace the axes of nuclear spin in the examination subject from an equilibrium position so that nuclear magnetic resonance signals generated by the spin precession during relaxation can be obtained.

Such an apparatus is generally described, for example, in German OS No. 33 40 523, corresponding to copending U.S. Application Ser. No. 666,656, filed Oct. 31, 1984 (Wilfried Loeffler and Arnulof Oppelt). The conventional elements of such an apparatus are schematically shown in FIG. 1.

The apparatus shown in FIG. 1 includes coils 1, 2, 3 and 4 connected to a power supply 11 for generating a constant fundamental magnetic field $B_0$. An examination subject 5, such as a patient, is disposed within the coils 1 through 4. A plurality of sets of gradient coils are also provided, in which the examination subject 5 is disposed, the gradient coils being arranged for generating orthogonal magnetic field gradients in the x, y and z directions in accordance with the coordinate system 6 shown in FIG. 1. For simplicity, only gradient coils 7 and 8 are shown in FIG. 1, connected to a power supply 12. The coils 7 and 8 generate an x-gradient in combination with a pair (not shown) of identical gradient coils disposed on the opposite side of the subject 5. Coils (not shown) for generating a y-gradient are disposed above and below the examination subject 5, parallel thereto. Another set of gradient coils (not shown) for generating the z-gradient field are disposed at the head and feet of the examination subject 5 at a right angle relative to the longitudinal axis of the subject 5.

A radio-frequency coil 9 is provided in this known arrangement which simultaneously functions to excite nuclear resonance in the subject 5, and to acquire the resulting nuclear magnetic resonance signals.

The elements 1 through 9 bounded by the dot-dash line 10 constitute the actual examination apparatus in which the patient is disposed. The power supplies 11 and 12, and other elements described below, are connected thereto. The radio-frequency coil 9 is supplied with radio-frequency pulses from a radio-frequency oscillator 15 through a modulator 13, such as a switch, and a transmission amplifier 14. Nuclear magnetic resonance signals are acquired by the coil 9 and supplied through a signal amplifier 16 and a phase-sensitive recitifer 17 to a process control computer 18. The computer 18 constructs an image from the acquired data, which is visually displayed on a monitor 19. The computer 18 also controls operation of the modulator 13 via a control line 20, and controls operation of the gradient fields power supply 12 via a control line 22. The output of the oscillator 15 is also supplied to the phase-sensitive rectifier 17 via a line 21, and is thus also supplied to the computer 18.

In order to produce an image of the examination subject 5 by means of a nuclear magnetic resonance, for example, the radio-frequency field may be energized in the presence of an z-gradient field. The resonance condition for only one slice in the examination subject 5 will thus be satisfied, so that a selective excitation of the nuclear spins occurs only in this slice. By means of subsequently generating x- and y-gradients, an image can be obtained for the nuclear spin distribution of the examination subject 5. This can be undertaken based on known methods such as the Fourier transformation method or the projection reconstruction method. Both methods are described, for example, in European Application No. 00 74 022.

A problem in the operation of a nuclear magnetic resonance tomography apparatus of the type described above is that the radio-frequency coil must be exactly balanced.

SUMMARY OF THE INVENTION

It is an object of the present invention to provide an improved nuclear magnetic resonance tomography apparatus and method for operating such an apparatus wherein balancing of the means for acquiring the nuclear magnetic resonance signals is not necessary.

The above object is achieved in accordance with the principles of the present invention by galvanically coupling the means for acquiring nuclear magnetic resonance signals directly to the examination subject. The examination subject thus becomes a part of the reception antenna or its feed line. As used herein, the term "galvanic coupling" means a direct, as opposed to an inductive, electrical connection to the body of the examination subject.

In one embodiment of the invention, only a portion of the examination subject is galvanically coupled to the signal acquiring means.

DESCRIPTION OF THE PREFERRED EMBODIMENTS

Figure 1:
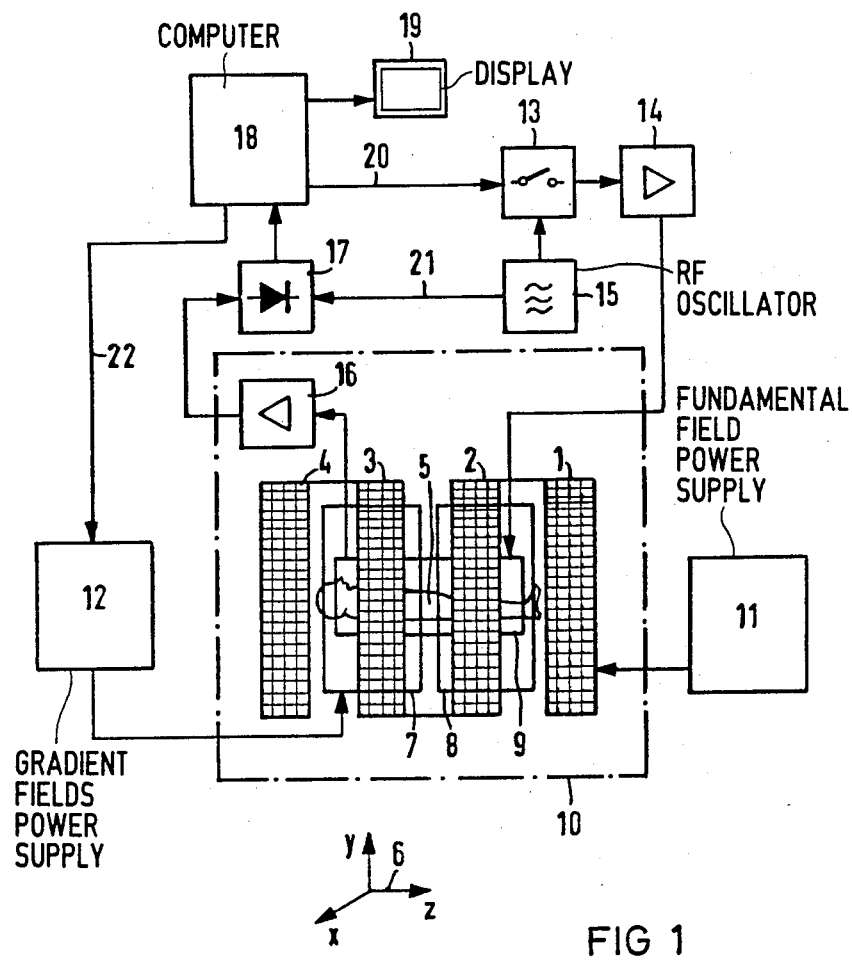
FIG. 1 is a schematic representation of the basic elements of a conventional nuclear magnetic resonance tomography apparatus.
Figure 2:
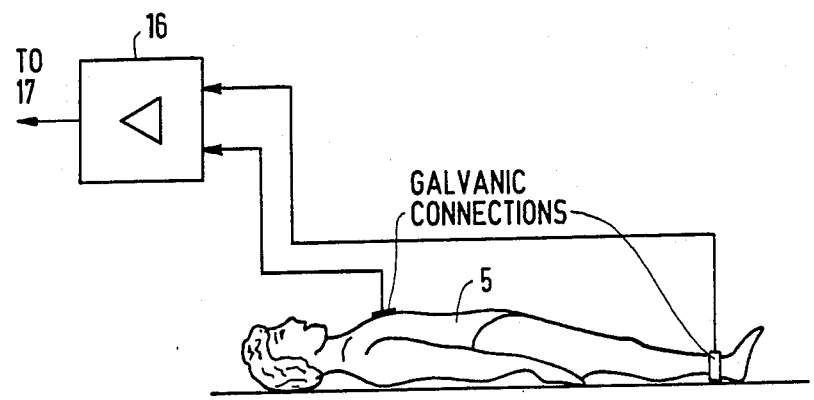
FIG. 2 is a schematic representation of a portion of a nuclear magnetic resonance tomography apparatus constructed in accordance with the principles of the present invention for use in the conventional apparatus of FIG. 1.

The improvement in a nuclear magnetic resonance tomography apparatus constructed in accordance with the principles of the present invention is schematically shown in FIG. 2. The portion of the apparatus shown in FIG. 2 is intended for connection to and use with the remaining elements of a nuclear magnetic resonance tomography apparatus as shown, for example, in FIG. 1. In the embodiment of FIG. 2, the examination subject 5 is galvanically connected at two locations to the signal amplifier 16. This type of connection can be referred to as a polar connection, and only that portion of the examination subject 5 for which an image to be generated must be disposed between the two galvanic connections.

Otherwise, all portions of the apparatus shown in FIG. 1 can be incorporated for use with the improvement of FIG. 2. Known image reconstruction methods can be used. Images which are at least equivalent to images with inductive coupling by means of a conventional radio-frequency coil, such as the coil 9 shown in FIG. 1, can be produced with the galvanic connections or coupling shown in FIG. 2. The outlay for balancing the radio-frequency coil for signal reception is thereby eliminated.

The invention is based on the preception that the nuclear magnetic resonance signal generates electromagnetic fields in the examination subject 5, the examination subject 5 acting as a dielectric. These electromagnetic fields (in particular, the electrical components thereof) are then galvanically diverted in accordance with the invention. The patient thus becomes a portion of the reception antenna in the signal evaluation. The signals useful for generating an NMR image can be separated from other unwanted signals in the normal manner by suitable filtering, since the frequency of the desired NMR signals is always precisely known. Any suitable conductor of the type known to those skilled in the art for direct acquisition of body electrical signals from a patient, such as conventional ECG electrodes, may be used for the galvanic coupling.

Figure 3:
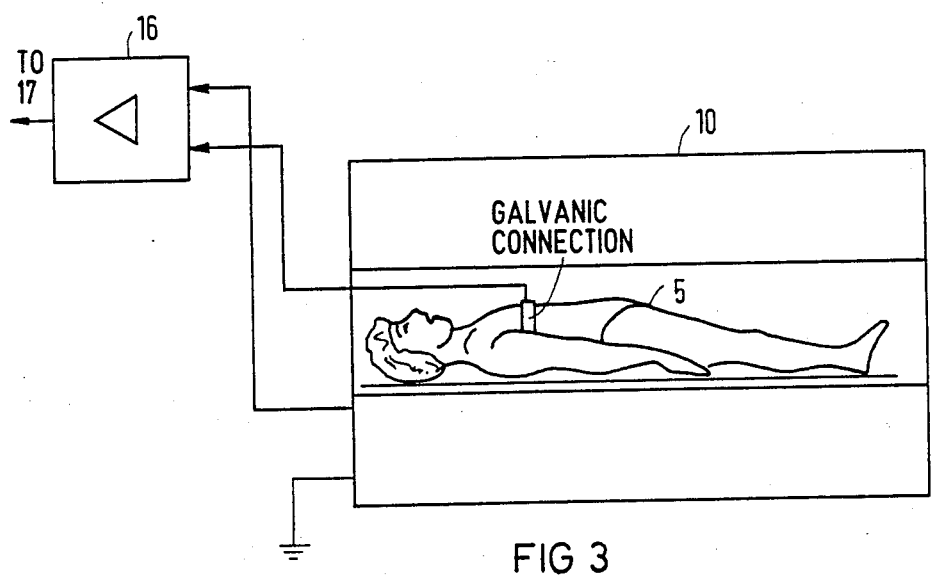
FIG. 3 is a further embodiment of the nuclear magnetic resonance tomography apparatus constructed in accordance with the principles of the present invention.

Another embodiment of the invention is shown in FIG. 3, which may be termed a monopolar coupling. In this embodiment, only one galvanic connection is applied to the examination subject 5, and the other input of the signal amplifier 16 is connected to a grounded potential of the examination apparatus 10.

Although modifications and changes may be suggested by those skilled in the art it is the intention of the inventors to embody within the patent warranted hereon all changes and modifications as reasonably and properly come within the scope of their contribution to the art.

We claim as our invention:

1. In a nuclear magnetic resonance tomography apparatus for displaying an image of a selected interior plane of an examination subject having nuclear spins, said apparatus including means for generating a fundamental magnetic field in which said examination subject is disposed, means for generating a plurality of gradient fields in which said examination subject is disposed, and means for displacing the nuclear spins in said examination subject from an equilibrium position, the improvement comprising:

a galvanic connection adapted to be applied to said examination subject; and means for acquiring nuclear magnetic spin signals from said examination subject generated by spin precession during return of said spins to said equilibrium position through said galvanic connection.

2. The improvement of claim 1 further comprising a second galvanic connection adapted to be applied to said examination subject, said galvanic connection and said second galvanic connection being disposed with said portion of said examination subject for which an image is to be generated being between said galvanic connections.

3. The improvement of claim 1, wherein said means for acquiring nuclear magnetic spin signals includes a signal amplifier having two inputs, and wherein one of said inputs is connected to receive said nuclear magnetic spin signals from said galvanic connection, and wherein the other of said inputs is connected to a ground potential.

4. A method for operating a nuclear magnetic resonance tomography apparatus for generating an image of a selected plane of an examination subject having nuclear spins comprising the steps of:

generating a fundamental magnetic field in which said examination subject is disposed;

generating a plurality of gradient magnetic fields in which said examination subject is disposed;

displacing the nucelar spins of said examination subject in the presence of said fundamental magnetic field and at least one gradient magnetic field from an equilibrium position; and acquiring nuclear magnetic resonance signals from said examination subject generated by spin precession in said examination during return of said spins to said equilibrium position by direct galvanic connection to said examination subject.

* * * * *